(12) United States Patent
Fukuda et al.

(10) Patent No.: US 8,987,986 B2
(45) Date of Patent: Mar. 24, 2015

(54) FLUORESCENT SUBSTANCE, LIGHT-EMITTING DEVICE AND METHOD FOR PRODUCING FLUORESCENT SUBSTANCE

(71) Applicant: Kabushiki Kaisha Toshiba, Tokyo (JP)

(72) Inventors: Yumi Fukuda, Tokyo (JP); Naotoshi Matsuda, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/845,554

(22) Filed: Mar. 18, 2013

(65) Prior Publication Data
US 2014/0084782 A1    Mar. 27, 2014

(30) Foreign Application Priority Data
Sep. 25, 2012   (JP) ................................. 2012-211074

(51) Int. Cl.
*C09K 11/77* (2006.01)
*H05B 33/12* (2006.01)
*H01L 33/50* (2010.01)

(52) U.S. Cl.
CPC ......... *C09K 11/7718* (2013.01); *C09K 11/7721* (2013.01); *H05B 33/12* (2013.01); *H01L 33/502* (2013.01)
USPC ....... 313/503; 252/301.4 F; 264/21

(58) Field of Classification Search
USPC ...... 313/501, 503, 507; 252/301.4 F, 301.4 R
See application file for complete search history.

(56) References Cited

U.S. PATENT DOCUMENTS

| 7,611,642 | B2 * | 11/2009 | Takahashi et al. ...... 252/301.4 F |
| 8,147,718 | B2 * | 4/2012 | Hirosaki ................ 252/301.4 F |
| 8,450,923 | B2 * | 5/2013 | Fukuda et al. ................ 313/503 |

(Continued)

FOREIGN PATENT DOCUMENTS

| CN | 101346452 A | 1/2009 |
| CN | 102399556 A | 4/2012 |

(Continued)

OTHER PUBLICATIONS

Extended European Search Report issued Dec. 17, 2013 in Patent Application No. 13159292.5.

(Continued)

*Primary Examiner* — Tracie Y Green
(74) *Attorney, Agent, or Firm* — Oblon, Spivak, McClelland, Maier & Neustadt, L.L.P.

(57) ABSTRACT

The fluorescent substance according to the present disclosure emits luminescence with a peak in the wavelength range of 500 to 600 nm under excitation by light with a peak in the wavelength range of 250 to 500 nm, and has an optical absorption coefficient $\alpha_{560nm}$ of $4\times10^{-5}$ or less at 560 nm. The substance is represented by the following formula (1):

$$(M_{1-x}Ce_x)_{2y}Al_zSi_{10-z}O_uN_w \qquad (1).$$

In the formula, M is a metal element selected from the group consisting of Ba, Sr, Ca, Mg, Li, Na and K; and x, y, z, u and w are variables satisfying the conditions of $0<x\leq1$, $0.8\leq y\leq1.1$, $2\leq z\leq3.5$, $u\leq1$, $1.8\leq z-u$ and $13\leq u+w\leq15$, respectively.

12 Claims, 3 Drawing Sheets

(56) References Cited

U.S. PATENT DOCUMENTS

| | | | |
|---|---|---|---|
| 8,482,192 B2* | 7/2013 | Fukuda et al. | 313/503 |
| 8,569,943 B2* | 10/2013 | Mitsuishi et al. | 313/483 |
| 2003/0052595 A1 | 3/2003 | Ellens et al. | |
| 2006/0197439 A1 | 9/2006 | Sakane et al. | |
| 2009/0267485 A1 | 10/2009 | Nagatomi et al. | |
| 2010/0001234 A1 | 1/2010 | Gotoh et al. | |
| 2010/0013375 A1 | 1/2010 | Maruyama et al. | |
| 2012/0104317 A1 | 5/2012 | Nagatomi et al. | |
| 2013/0241387 A1* | 9/2013 | Fukuda et al. | 313/47 |

FOREIGN PATENT DOCUMENTS

| | | |
|---|---|---|
| TW | 200712177 A | 4/2007 |
| TW | 201335336 A1 | 9/2013 |

OTHER PUBLICATIONS

G. Blasse, et al., "Fluorescence of $Eu^{2+}$-Activated Silicates" Philips Res. Repts., vol. 23, 1968, pp. 189-200.

U.S. Appl. No. 14/184,846, filed Feb. 20, 2014, Fukuda, et al.

Office Action issued Jul. 11, 2014 in Taiwanese Patent Application No. 102108826 (with English translation).

U.S. Appl. No. 14/134,293, filed Dec. 19, 2013, Matsuda, et al.

Office Action issued Aug. 28, 2014, in China Patent Application No. 201310086523.8 (with English-language Translation).

Office Action issued Sep. 12, 2014 in Japanese Patent Application No. 2012-211074 (with English translation).

Office Action issued May 23, 2014 in Korean Patent Application No. 10-2013-0028596 (with English language translation).

* cited by examiner

FLUORESCENT SUBSTANCE, LIGHT-EMITTING DEVICE AND METHOD FOR PRODUCING FLUORESCENT SUBSTANCE

CROSS-REFERENCE TO RELATED APPLICATIONS

This application is based upon and claims the benefit of priority from the prior Japanese Patent Application No. 2012-211074, filed on Sep. 25, 2012, the entire contents of which are incorporated herein by reference.

FIELD

Embodiments of the present disclosure relate to a fluorescent substance, a light-emitting device, and a method for producing the fluorescent substance.

BACKGROUND

A white light-emitting device comprises a combination of, for example, a blue LED, a fluorescent substance that emits red light under excitation by blue light, and another fluorescent substance that emits green light under excitation by blue light. However, if containing a fluorescent substance that emits yellow light under excitation by blue light, the white light-emitting device can be produced by use of fewer kinds of fluorescent substances. The yellow-light emitting fluorescent substances include Eu-activated orthosilicate phosphors.

Various studies have been made on the use of the yellow-light emitting fluorescent substances, and accordingly demands have been increasing for the fluorescent substances on temperature characteristics, quantum yield and color rendering properties.

DETAILED DESCRIPTION

Figure 1:
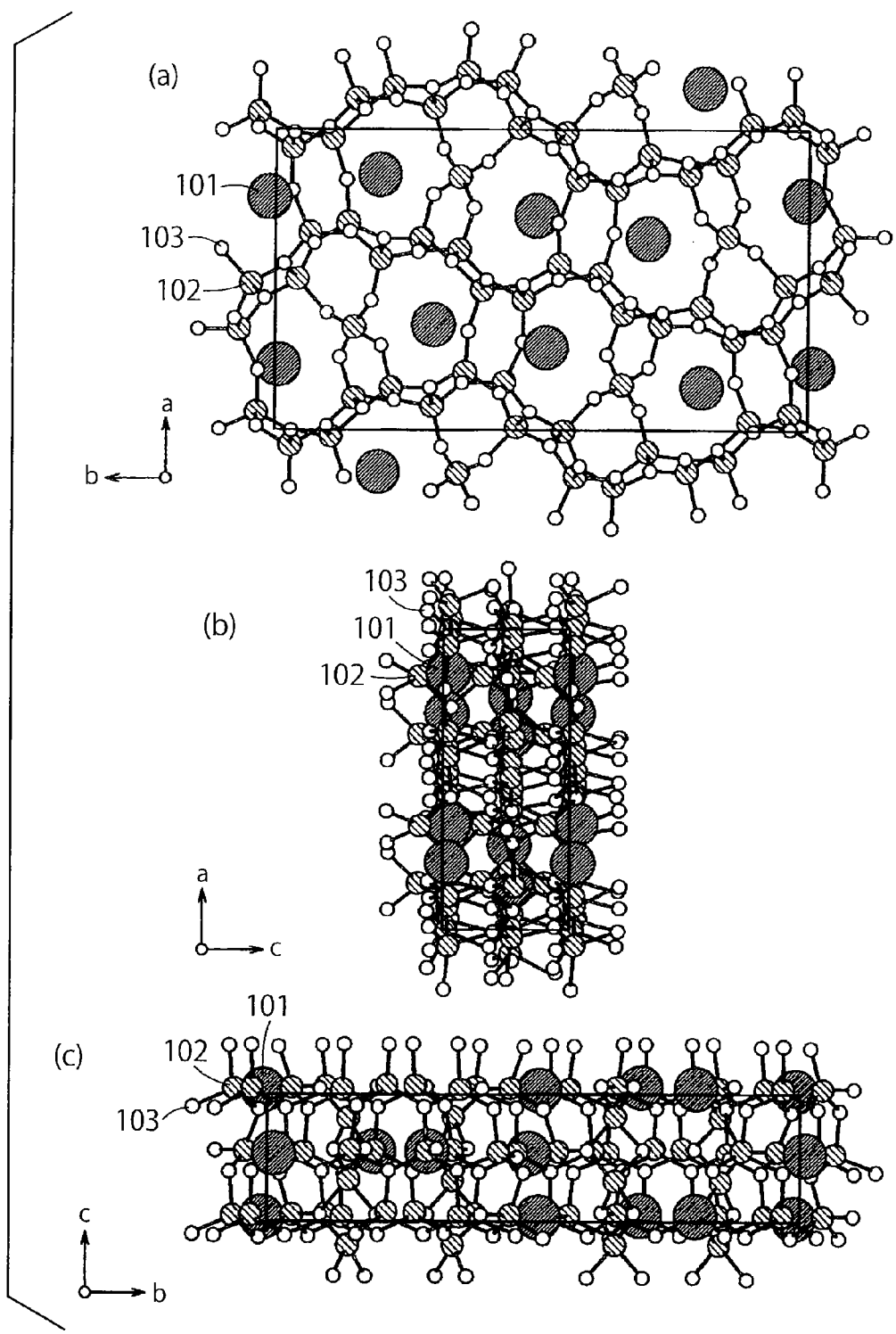
FIG. 1 shows the crystal structure of $Sr_2Al_3Si_7ON_{13}$.

Embodiments will now be explained with reference to the accompanying drawings.

An embodiment of the present disclosure provides a fluorescent substance which emits luminescence with a peak in the wavelength range of 500 to 600 nm under excitation by light with a peak in the wavelength range of 250 to 500 nm, which has an optical absorption coefficient $\alpha_{560nm}$ of $4\times10^{-5}$ or less at 560 nm, and which is represented by the following formula (1):

in which M is a metal element selected from the group consisting of Ba, Sr, Ca, Mg, Li, Na and K; and x, y, z, u and w are variables satisfying the conditions of $0<x\leq1$,
$0.8\leq y\leq1.1$,
$2\leq z\leq3.5$,
$u\leq1$,
$1.8\leq z-u$ and
$13\leq u+w\leq15$,
respectively.

The embodiment is described below in detail.

The fluorescent substance according to the embodiment emits luminescence with a peak in the wavelength range of 500 to 600 nm under excitation by light with a peak in the wavelength range of 250 to 500 nm, and hence is a phosphor capable of radiating light in the color range of yellowish green to orange. Since mainly emitting light in the color of yellow, that fluorescent substance is hereinafter often referred to as "yellow-light emitting phosphor". The yellow-light emitting phosphor is characterized by absorbing a small amount of light in the emission wavelength region. Specifically, the fluorescent substance of the embodiment has an absorption coefficient ($\alpha_{560nm}$) of $4\times10^{-5}$ or less, preferably $2\times10^{-5}$ or less at 560 nm. The fluorescent substance comprises essentially the same matrix as the $Sr_2Si_7Al_3ON_{13}$ crystal structure, and the matrix is activated with an emission center element such as Ce. The yellow-light emitting phosphor according to the embodiment is represented by the following formula (1):

In the formula, M is a metal element selected from the group consisting of Ba, Sr, Ca, Mg, Li, Na and K, and is preferably Sr; and x, y, z, u and w are variables satisfying the conditions of $0<x\leq1$, preferably $0.001\leq x\leq0.5$,
$0.8\leq y\leq1.1$, preferably $0.85\leq y\leq1.06$,
$2\leq z\leq3.5$, preferably $2.5\leq z\leq3.3$,
$u\leq1$ preferably $0.001 0.8$,
$1.8\leq z-u$, preferably $2.5\leq z-u$, and
$13\leq u+w\leq15$, preferably $13.2\leq u+w\leq14.2$, respectively The metal element M is preferably Sr so that the emission spectrum may have a peak positioned within a proper wavelength region. Two or more elements can be used in combination as the metal element M.

In the formula, Ce functions as the emission center element. One or more elements selected from the group consisting of Tb, Eu and Mn can be used in combination with Ce as the emission center element.

As shown in the above formula (I), the metal element M is at least partly replaced with the emission center element Ce. Since containing Ce as the emission center element, the fluorescent substance of the embodiment emits light in the color range of yellowish green to orange, namely, luminescence with a peak in the wavelength range of 500 to 600 nm, when excited by light with a peak in the wavelength range of 250 to 500 nm. If at least 0.1 mol % of the metal element M is replaced with Ce (that is, if x is at least 0.001), the fluorescent substance can have sufficient luminous efficiency. The metal element M may be completely replaced with Ce (that is, x may be 1), but the replacement ratio with Ce is preferably 50 mol % or less (that is, x is preferably 0.5 or less) so as to avoid decrease of the emission probability (that kind of decrease is often referred to as "concentration quenching"). Accordingly, the variable x satisfies the condition of $0<x\leq1$ necessarily, $0.001\leq x\leq0.5$ preferably.

The variable y is 0.8 or more, preferably 0.85 or more, so as to avoid formation of crystal defects and to prevent decrease of the efficiency. On the other hand, however, the variable y is necessarily 1.1 or less, preferably 1.06 or less so that excess of the alkaline earth metal may not deposit in the form of a variant phase to decrease the luminous efficiency. Accordingly, the variable y satisfies the condition of $0.8 \leq x \leq 1.1$ necessarily, $0.85 \leq x \leq 1.06$ preferably.

The variable z is necessarily 2 or more, preferably 2.5 or more so that excess Si may not deposit in the form of a variant phase to decrease the luminous efficiency. On the other hand, however, if it is more than 3.5, excess Al may deposit in the form of a variant phase to decrease the luminous efficiency. The variable z is hence necessarily 3.5 or less, preferably 3.3 or less. Accordingly, the variable z satisfies the condition of $2 \leq z \leq 3.5$ necessarily, $2.5 \leq z \leq 3.3$ preferably.

The variable u is necessarily 1 or less, preferably 0.8 or less so that crystal defects may not increase to lower the luminous efficiency. On the other hand, however, it is preferably 0.001 or more so as to maintain the desired crystal structure and to keep properly the wavelength of the emission spectrum. Accordingly, the variable u satisfies the condition of $u \leq 1$ necessarily, $0.001 \leq u \leq 0.8$ preferably.

The value of z−u is necessarily 1.8 or more, preferably 2.0 or more so that the fluorescent substance of the embodiment can retain the desired crystal structure and also so that variant phases may not be formed in the production process of the fluorescent substance. For the same reasons, the value of u+w satisfies the condition of $13 \leq u+w \leq 15$ necessarily, $13.2 \leq u+w \leq 14.2$ preferably.

Since fulfilling all the aforementioned conditions, the fluorescent substance of the present embodiment can highly efficiently emit yellow light having excellent color rendering properties under excitation by light with a peak in the wavelength range of 250 to 500 nm. Further, the yellow-light emitting phosphor according to the present embodiment is also excellent in temperature characteristics.

The yellow-light emitting phosphor of the embodiment can be said to be based on $Sr_2Al_3Si_7ON_{13}$, in which the constituting elements Sr, Si, Al, O and N are replaced with other elements and/or the matrix is fused with other metal elements such as Ce to form a solid solution. These modifications such as replacement often slightly change the crystal structure. However, the atomic positions therein, which depend on such conditions as the crystal structure, the sites occupied by the atoms therein and their atomic coordinates, are seldom changed so greatly as to break the chemical bonds among the skeleton atoms.

The fluorescent substance according to the embodiment is based on an inorganic compound having essentially the same crystal structure as $Sr_2Al_3Si_7ON_{13}$ provided that the constituting element M is partly replaced with the emission center ion Ce and that the content of each element is restricted in the particular range. Under those conditions, the fluorescent substance shows such favorable properties as to have excellent temperature characteristics and as to give highly efficient luminescence the spectrum of which has a wide half-width.

The yellow-light emitting phosphor according to the embodiment has a low absorption coefficient in the emission wavelength region. Specifically, the absorption coefficient $\alpha_{560nm}$ at 560 nm is necessarily $4 \times 10^{-5}$ or less, preferably $2 \times 10^{-5}$ or less. Since the optical absorption at 560 nm is presumed to be mainly attributed to $Ce^{4+}$ ions, the small absorption coefficient at 560 nm indicates that the content of $Ce^{4+}$ ions is relatively small. On the other hand, if the content of $Ce^{3+}$ ions is large, the absorption tends to increase in the blue range. Accordingly, the phosphor preferably has a large absorption coefficient $\alpha_{430nm}$ at 430 nm, and hence the ratio of $\alpha_{560nm}/\alpha_{430nm}$ is preferably small. Specifically, the ratio of $\alpha_{560nm}/\alpha_{430nm}$ is preferably $5.5 \times 10^{-4}$ or less, further preferably $4.5 \times 10^{-4}$ or less.

The absorption coefficient of fluorescent substance can be calculated according to the following formula:

optical absorption coefficient=light scattering coefficient×absorbance$^2$/2/reflectance=3.96/grain diameter/density*absorbance$^2$/(1−absorbance).

In the formula, the light scattering coefficient can be estimated from measured values of the grain diameter and the density. The absorbance can be measured with a spectrophoto-meter, and the grain diameter d can be also measured with a particle size analyzer, a scanning electron microscope or a fluorescence microscope.

Since thus having small optical absorption near 560 nm in the emission range, the fluorescent substance less suffers from, what is called, "re-absorption" and thereby is improved in luminous efficiency.

In the fluorescent substance, the ratio of the amount of $Ce^{4+}$ ions to the total amount of Ce ions can be determined from the absorbance Ry of light with a peak wavelength between 550 to 580 nm, the absorbance Rr of light with a peak wavelength at 800 nm, the grain diameter d and the density ρ of the substance, in accordance with the following formula:

$Ce^{4+}/Ce=3.96/d/\rho \times \{Ry^2/(1-Ry)-Rr^2/(1-Rr)\}10^4$.

The values Ry, Rr and the grain diameter can be measured in the same manner as described above.

The reason why the ratio of $Ce^{4+}$ ions can be thus determined is that the absorption in the visible range is attributed to not only $Ce^{3+}$ ions but also coloring (Rr) evenly ranging the whole wavelength region and selective coloring (Ry) by $Ce^{4+}$ ions in the yellow range.

The content of $Ce^{4+}$ ions is thought to relate to the optical absorption in the embodiment, but can be also thought to relate to the crystal defects. Specifically, if there are many defects, particularly nitrogen defects, in the crystal, the content of $Ce^{4+}$ ions tends to increase. The fluorescent substance of the embodiment is a multi-component oxide phosphor, and hence crystal defects (paramagnetic defects) are likely to be formed therein. Since those defects tend to oxidize Ce, the crystal having many defects often contains $Ce^{4+}$ ions in a large amount. Accordingly, there are preferably a small amount of defects in the crystal of the fluorescent substance according the embodiment.

Those crystal defects can be measured by means of ESR in the form of paramagnetic defect density. In the ESR measurement, a magnetic field is swept while the sample is being exposed to microwaves. When an unpaired electron is placed in the magnetic field, its energy level is split. The ESR is a spectral analysis of measuring transition between those split levels. According as the magnetic field increases, the energy gap also increases between the split levels. When this gap matches up to the energy of the microwaves, the microwaves are observed to be absorbed. The ESR spectrum is normally expressed in the form of a differential curve, and hence a curve of absorption or signal strength thereof can be obtained by integrating the differential curve once or twice, respectively The yellow-light emitting phosphor of the embodiment can be produced in any manner. However, since the content of $Ce^{4+}$ ions in the crystal greatly affects the characteristics of the phosphor as described above, it is important to control the $Ce^{4+}$ content.

Specifically, the fluorescent substance of the embodiment can be produced by mixing and then firing powdery materials containing the elements. However, in the production process, it is preferred to use particular materials and to control the firing atmosphere.

The material of M can be selected from the nitride and carbide of M. The material of Al can be selected from the nitride, oxide and carbide of Al, and the material of Si can be selected from the nitride, oxide and carbide of Si. The material of the emission center element Ce can be selected from the oxide, nitride and carbonate of Ce.

Nitrogen can be supplied from the nitride materials or a nitrogen atmosphere adopted in the firing step, and oxygen can be supplied from the oxide materials or surface oxide layers of the nitride materials.

For example, $Sr_3N_2$, SrN, $Si_3N_4$, $Al_2O_3$, AlN and $CeO_2$ are mixed in such loading amounts as give the aimed contents. The material $Sr_3N_2$ may be replaced with $Sr_2N$, SrN or the like or a mixture thereof. In order to obtain a uniform powdery mixture, it is preferred to mix the powdery materials in the order of increasing the weight.

The materials are mixed, for example, in a mortar in a glove box. The mixture powder is placed in a crucible and then fired under particular conditions to obtain the fluorescent substance according to the embodiment. There are no particular restrictions on the materials of the crucible, which is made of, for example, boron nitride, silicon nitride, silicon carbide, carbon, aluminum nitride, SiAlON, aluminum oxide, molybdenum or tungsten.

The mixture powder is preferably fired under a pressure more than the atmospheric pressure. Since the silicon nitride hardly decomposes under a high pressure, it is advantageous to fire the mixture under a pressure more than the atmospheric pressure. In order to prevent the silicon nitride from decomposing at a high temperature, the pressure is preferably 5 atm or more and the firing temperature is preferably in the range of 1500 to 2000° C. If those conditions are satisfied, the aimed fired product can be obtained without suffering from troubles such as sublimation of the materials and the product. The firing temperature is more preferably in the range of 1800 to 2000° C.

For the purpose of avoiding oxidation of AlN, the firing step is preferably carried out in a nitrogen atmosphere. The atmosphere may contain hydrogen in an amount of about 90 atm % or less. However, if the firing atmosphere is too reductive, nitrogen defects are formed in the phosphor crystal and accordingly the formation of $Ce^{4+}$ ions tends to be promoted in the fluorescent substance. This tendency is enhanced in the case where the firing step is performed in a heating furnace equipped with a generally used carbon-made heater and insulation. The firing atmosphere, therefore, needs to be controlled when the materials are fired. For example, it is possible to control the contents of reductive gases such as hydrogen in the atmosphere, or the material mixture can be placed in a crucible with a lid. The crucible can be further placed in a lidded outer container such as a sheath, and then subjected to the firing step. Here, the crucible and the outer container are not necessarily covered tightly. If only oxidative or reductive gases are prevented from freely coming into or out of those vessels, the formation of $Ce^{4+}$ ions can be controlled.

After the firing step is carried out at the above temperature for 0.5 to 4 hours, the fired product is taken out of the crucible and then pulverized. The pulverized product is preferably fired again under the same conditions. If those procedures in series of taking out, pulverizing and firing again are repeated 0 to 10 times, the product can obtain advantages that the crystal grains are less fused and hence the formed powder is uniform both in composition and in crystal structure.

After the firing step, the product is subjected to aftertreatment such as washing, if necessary, to obtain a fluorescent substance according to an embodiment. The washing can be carried out, for example, by use of pure water or acid. Examples of the acid include: inorganic acids, such as sulfuric acid, nitric acid, hydrochloric acid and hydrofluoric acid; organic acids, such as formic acid, acetic acid and oxalic acid; and mixtures thereof.

After washed with acid, the product may be subjected to post-anneal treatment, if necessary. The post-anneal treatment, which can be carried out, for example, in a reductive atmosphere containing nitrogen and hydrogen, improves the crystallinity and the luminous efficiency.

Figure 2:
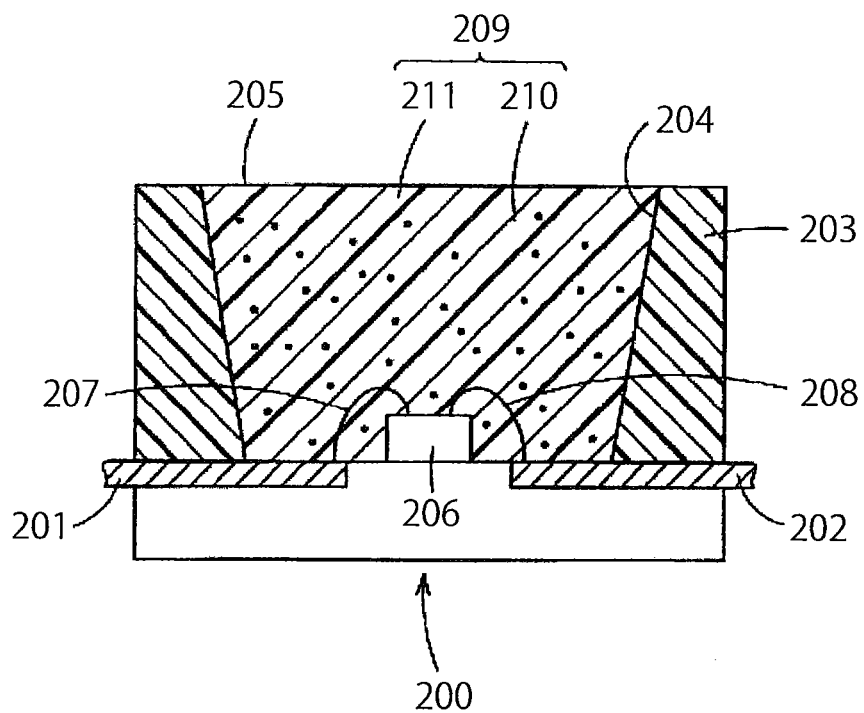
FIG. 2 shows a vertical sectional view schematically illustrating a light-emitting device according to an embodiment.

The light-emitting device according to an embodiment of the present disclosure comprises a luminescent layer containing the above fluorescent substance and a light-emitting element capable of exciting the fluorescent substance. FIG. 2 shows a vertical sectional view schematically illustrating a light-emitting device according to an embodiment of the present disclosure.

The light-emitting device shown in FIG. 2 comprises leads 201, 202 and a package cup 203 on a substrate 200. The package cup 203 and the substrate 200 are made of resin. The package cup 203 has a concavity 205 in which the top opening is larger than the bottom. The inside wall of the concavity 205 functions as a reflective surface 204.

At the center of the nearly circular bottom of the concavity 205, there is a light-emitting element 206 mounted with Ag paste or the like. The light-emitting element 206 radiates light with a peak in the wavelength range of 400 to 500 nm. Examples of the light-emitting element 206 include light-emitting diodes and laser diodes, such as GaN type semiconductor light-emitting chips, but they by no means restrict the light-emitting element.

The p- and n-electrodes (not shown) of the light-emitting element 206 are connected to the leads 201 and 202 by way of bonding wires 207 and 208 made of Au or the like, respectively. The positions of the leads 201 and 202 can be adequately modified.

The light-emitting element 206 may be of a flip chip type in which the n- and p-electrodes are placed on the same plane. This element can avoid troubles concerning the wires, such as disconnection or dislocation of the wires and light-absorption by the wires. In that case, therefore, it is possible to obtain a semiconductor light-emitting device excellent both in reliability and in luminance. Further, it is also possible to adopt a light-emitting element having an n-type substrate so as to produce a light-emitting device constituted as described below. In that device, an n-electrode is formed on the back surface of the n-type substrate while a p-electrode is formed on the top surface of a p-type semiconductor layer beforehand laid on the substrate. The n-electrode is mounted on one of the leads, and the p-electrode is connected to the other lead by way of a wire.

In the concavity 205 of the package cup 203, there is a luminescent layer 209 containing the fluorescent substance 210 according to an embodiment of the present disclosure. In the luminescent layer 209, the fluorescent substance 210 is contained in a resin layer 211 made of, for example, silicone resin in an amount of 5 to 60 wt %. As described above, the fluorescent substance according to the embodiment comprises $Sr_2Al_3Si_7ON_{13}$ matrix. Since that kind of oxynitride has high covalency, the fluorescent substance of the embodiment is generally so hydrophobic that it has good compatibility with the resin. Accordingly, scattering at the interface between the resin and the fluorescent substance is prevented enough to improve the light-extraction efficiency.

The yellow-light emitting phosphor according to the embodiment has good temperature characteristics, and can highly efficiently emit yellow light having excellent color rendering properties. This phosphor is used in combination with a light-emitting element radiating light with a peak in the wavelength range of 400 to 500 nm, and thereby it becomes possible to provide a white light-emitting device excellent in luminescent properties.

The size and kind of the light-emitting element 206 and the dimension and shape of the concavity 205 can be properly changed.

The light-emitting device according to an embodiment of the present disclosure is not restricted to the package cup-type shown in FIG. 2, and can be freely applied to any type of devices. For example, even if the fluorescent substance of the embodiment is used in a shell-type or surface-mount type LED, the same effect can be obtained.

Figure 3:
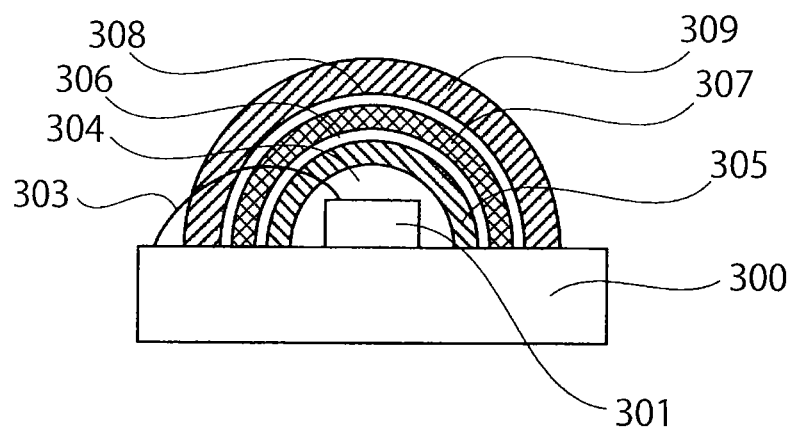
FIG. 3 shows a vertical sectional view schematically illustrating a light-emitting device according to another embodiment.

FIG. 3 shows a vertical sectional view schematically illustrating a light-emitting device according to another embodiment of the disclosure. In the shown device, p- and n-electrodes (not shown) are formed at the predetermined positions on a heat-releasing insulating substrate 300, and a light-emitting element 301 is placed thereon. The heat-releasing insulating substrate is made of, for example, AlN.

On the bottom of the light-emitting element 301, one of the electrodes of the element is provided and electrically connected to the n-electrode of the heat-releasing insulating substrate 300. The other electrode of the light-emitting element 301 is connected to the p-electrode (not shown) on the heat-releasing insulating substrate 300 by way of a gold wire. The light-emitting element 301 is a light-emitting diode radiating light with a peak in the wavelength range of 400 to 500 nm.

The light-emitting element 301 is successively domed with an inner transparent resin layer 304, a luminescent layer 305 and an outer transparent resin layer 306 in this order. The inner and outer transparent resin layers 304 and 306 are made of, for example, silicone resin. The luminescent layer 205 comprises the yellow-light emitting phosphor 210 of the embodiment contained in a resin layer 211 made of, for example, silicone resin.

In the production process of the light-emitting device shown in FIG. 3, the luminescent layer 305, which contains the yellow-light emitting phosphor of the embodiment, can be easily formed by use of techniques such as vacuum printing and drop-coating from a dispenser. Further, since positioned between the inner and outer transparent resin layers 304 and 306, the luminescent layer 305 also has the function of improving the extraction efficiency.

The luminescent layer in the light-emitting device according to the embodiment may contain not only the yellow-light emitting phosphor of the embodiment but also another fluorescent substance emitting green luminescence under excitation by blue light and still another fluorescent substance emitting red luminescence under excitation by blue light. If comprising that luminescent layer, the produced white light-emitting device is further improved in color rendering properties.

Even if excited by UV light in the wavelength range of 250 to 400 nm, the yellow-light emitting phosphor of the embodiment emits yellow luminescence. Accordingly, the fluorescent substance of the embodiment can be combined with, for example, another fluorescent substance emitting blue light under excitation by UV light and a UV light-emitting element such as a UV light-emitting diode, to produce a white light-emitting device. In that white light-emitting device, the luminescent layer may contain not only the yellow-light emitting phosphor of the embodiment but also a fluorescent substance emitting luminescence with a peak in another wavelength range under excitation by UV light. That fluorescent substance is, for example, a phosphor emitting red light under excitation by UV light or a phosphor emitting green light under excitation by UV light.

As described above, the fluorescent substance according to the embodiment has good temperature characteristics, and can highly efficiently emit yellow light having excellent color rendering properties. That yellow-light emitting phosphor of the embodiment is combined with a light-emitting element radiating light with a peak in the wavelength range of 250 to 500 nm, and thereby it becomes possible to produce a white light-emitting device excellent in luminescent properties by use of fewer kinds of fluorescent substances.

The following are concrete examples of the fluorescent substance and the light-emitting device according to the embodiment.

Example 1

As the materials of Sr, Ce, Si and Al, $Sr_3N_2$, $CeO_2$, $Si_3N_4$ and AlN were prepared, respectively. In a vacuum glove box, $Sr_3N_2$, $CeCl_2$, $Si_3N_4$ and AlN were weighed out in the amounts of 2.993 g, 0.155 g, 5.262 g and 1.537 g, respectively. The powdery materials were then dry-mixed in a planetary ball mill.

The obtained mixture was laid in a crucible made of boron nitride (BN), and the crucible was placed in a boron nitride-made container with a lid of 10 mm thickness (hereinafter, the container is referred to as "sheath" for the sake of convenience). The mixture was then fired at 1800° C. for 1 hour under 7.5 atm in a nitrogen atmosphere. The fired product was taken out of the crucible, and pulverized in an agate mortar. The pulverized product was again laid in the crucible, which was then placed in the sheath made of boron nitride, and fired at 1800° C. for 10 hours. Subsequently, the procedures in series of taking out, pulverizing and firing were once again repeated to obtain a fluorescent substance of Example 1.

The obtained substance was in the form of yellow powder, and was observed to emit yellow luminescence when excited by black light.

Comparative Example 1

The procedures of Example 1 were repeated except that the firing step was carried out without the sheath made of boron nitride, to obtain a fluorescent substance of Comparative example 1.

The obtained substance was in the form of yellow powder, and was observed to emit yellow luminescence when excited by black light.

Evaluation of Composition

The composition of each obtained fluorescent substance was analyzed to find the following results.

TABLE 1

|  | Sr | Al | Si | O | N | C | Ce |
|---|---|---|---|---|---|---|---|
| Ex. 1 | 7.50 | 9.75 | 29.0 | 1.60 | 52.0 | 0.09 | 0.16 |
| Com. 1 | 7.24 | 9.86 | 29.0 | 1.50 | 52.0 | 0.14 | 0.16 |

Evaluation of Paramagnetic Defects

The paramagnetic defects of the obtained fluorescent substances were measured to find that the phosphors of Example 1 and Comparative example 1 had the defects of $1.8 \times 10^{-5}$ spins/g and $4.3 \times 10^{-5}$ spins/g, respectively.

Evaluation of Luminescent Properties

Figure 4:
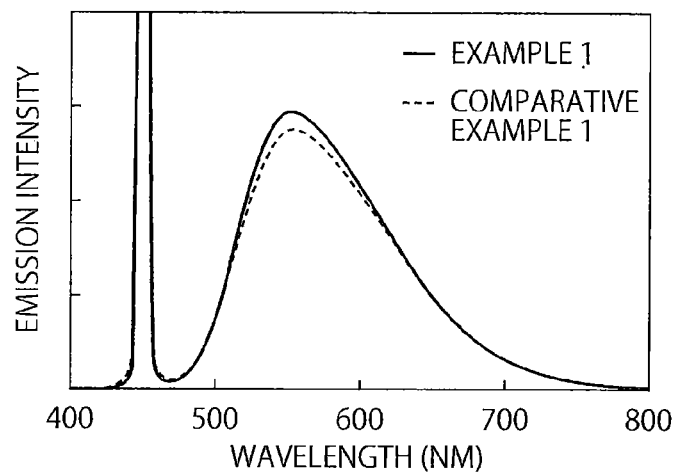
FIG. 4 shows emission spectra of the fluorescent substances obtained in Example 1 and Comparative example 1.

FIG. 4 shows the emission spectra of the fluorescent substances under excitation by light with a peak at 450 nm from a xenon lamp. In FIG. 4, the emission band with a narrow half-width around 450 nm is attributed to not the luminescence from the phosphors but the reflection of the excitation light. The spectra showed strong emission intensity at a peak wavelength of 554 nm, and the fluorescent substance of Example 1 was observed to give higher emission intensity than that of Comparative example 1. Further, the half-width was measure by means of a high speed multichannel photo detector, and found to be 115 nm. The half-width can be regarded as an index that indicates color rendering properties of white light radiated from the light-emitting device. Specifically, the wider the half-width is, the better color rendering properties the white light tends to have. Accordingly, the half-width of 115 nm indicates that the fluorescent substance of Example 1 can be advantageously used to obtain white light having excellent color rendering properties.

Figure 5:
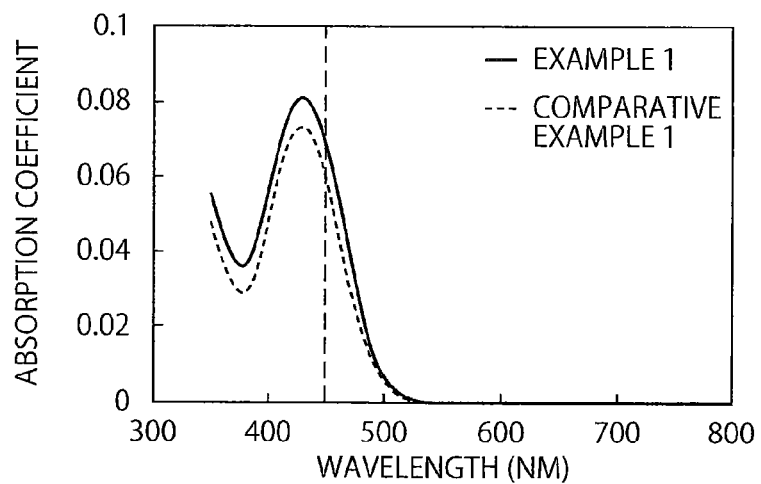
FIG. 5 shows absorption spectra of the fluorescent substances obtained in Example 1 and Comparative example 1.

FIG. 5 shows absorption coefficient spectra of the above fluorescent substances. The absorption coefficients were calculated according to the following formula:

$$\text{optical absorption coefficient} = \text{light scattering coefficient} * \text{absorbance}^2/2/\text{reflectance}$$

$$= 3.96/\text{grain diameter/density}$$

*absorbance$^2$/(1-absorbance).

Figure 6:
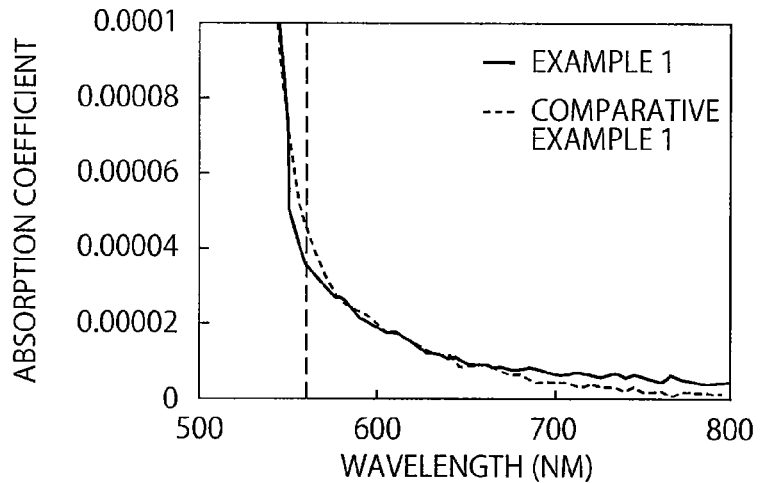
FIG. 6 shows absorption spectra of the fluorescent substances obtained in Example 1 and Comparative example 1.

In FIG. 5, the absorption band with a peak around 430 nm is attributed to Ce$^{3+}$ ions. In the crystal, Ce ions can be trivalent or tetravalent but all the Ce ions are preferably trivalent. That is because it is trivalent cerium ions that convert blue light into yellow light. FIG. 6 shows that the fluorescent substance of Example 1 has higher absorption coefficients attributed to Ce$^{3+}$ ions than that of Comparative example 1. FIG. 6 is an enlarged view of the longer wavelength range of FIG. 5, and in the wavelength range of 500 to 600 nm the fluorescent substance of Example 1 has lower absorption coefficients than that of Comparative example 1. The following shows the absorption coefficients $\alpha_{560nm}$ at 560 nm and $\alpha_{430nm}$ at 430 nm of the fluorescent substances of Example 1 and Comparative example 1.

TABLE 2

|  | $\alpha_{430nm}$ | $\alpha_{560nm}$ | $\alpha_{560nm}/\alpha_{430nm}$ |
| --- | --- | --- | --- |
| Ex. 1 | 0.081 | 3.6 × 10$^{-5}$ | 4.4 × 10$^{-4}$ |
| Com. 1 | 0.073 | 4.4 × 10$^{-5}$ | 6.0 × 10$^{-4}$ |

The above results indicate that the absorption coefficient $\alpha_{560nm}$ at 560 nm is 4×10$^{-5}$ or less and that fluorescent substance of Example 1 contains less Ce$^{4+}$ ions than that of Comparative example 1.

If absorbing light in the wavelength range of 500 to 600 nm, the fluorescent substance absorbs yellow light emitted from itself and hence impairs the quantum efficiency. Accordingly, it is preferred for the fluorescent substance not to absorb light in that wavelength range. The absorption in that wavelength range is presumed to be attributed to Ce$^{4+}$ ions, and the above results are thought to be because the use of the BN sheath prevented the formation of Ce$^{4+}$ ions. It can be also understood that the increase of the absorption coefficient at 430 nm is caused by decrease of Ce$^{4+}$ ions, namely, by increase of Ce$^{3+}$ ions.

The embodiment of the present disclosure provides a fluorescent substance which has favorable temperature characteristics and which can highly efficiently emit yellow light having excellent color rendering properties. The yellow-light emitting phosphor of the present embodiment is used in combination with a blue LED, and thereby it becomes possible to obtain a white light-emitting device excellent in luminescent properties.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A fluorescent substance which emits luminescence with a peak in the wavelength range of 500 to 600 nm under excitation by light with a peak in the wavelength range of 250 to 500 nm, which has an optical absorption coefficient $\alpha_{560nm}$ of 4×10$^{-5}$ or less at 560 nm, and which is represented by the following formula (1):

$(M_{1-x}Ce_x)_{2y}Al_zSi_{10-z}O_uN_w$       (1)

in which M is a metal element selected from the group consisting of Ba, Sr, Ca, Mg, Li, Na and K; and x, y, z, u and w are variables satisfying the conditions of
0<x≤1,
0.8≤y≤1.1,
2≤z≤3.5,
u≤1,
1.8≤z−u and
13≤u+w≤15, respectively.

2. The fluorescent substance according to claim 1, wherein M is Sr.

3. The fluorescent substance according to claim 1, which has such optical absorption coefficients $\alpha_{560nm}$ at 560 nm and $\alpha_{430nm}$ at 430 nm as satisfy the condition that the ratio $\alpha_{560nm}/\alpha_{430nm}$ is 5.5×10$^{-4}$ or less.

4. A light-emitting device comprising
a light-emitting element radiating light with a peak in the wavelength range of 250 to 500 nm, and
a luminescent layer containing a phosphor that emits yellow light when receiving the light from said light-emitting element; wherein
said yellow light-emitting phosphor is the fluorescent substance according to claim 1.

5. The device according to claim 4, wherein said luminescent layer further contains a green-light emitting phosphor and a red-light emitting phosphor.

6. A light-emitting device comprising
a light-emitting element radiating light with a peak in the wavelength range of 250 to 500 nm, and
a luminescent layer containing a phosphor that emits yellow light when receiving the light from said light-emitting element and another phosphor that emits blue light when receiving the light from said light-emitting element; wherein
said yellow light-emitting phosphor is the fluorescent substance according to claim 1.

7. A method for producing the fluorescent substance according to claim 1, comprising the steps of mixing a material of M selected from the nitride and carbide of M, a material of Al selected from the nitride, oxide and carbide of Al, a material of Si selected from the nitride, oxide and carbide of Si, and a material of Ce selected from the oxide, nitride and carbonate of Ce, to obtain a mixture; and firing said mixture.

8. The method according to claim 7, wherein said mixture is fired at a temperature of 1500 to 2000° C. under a pressure of 5 atm or more.

9. The method according to claim 7, wherein said mixture is fired in a nitrogen atmosphere.

10. The method according to claim 7, wherein said mixture of the materials is placed in a crucible with a lid and then the firing step is carried out.

11. The method according to claim 10, wherein said crucible is further placed in an outer container with a lid and then the firing step is carried out.

12. The method according to claim 7, which further comprises the step of washing the product after the firing step.

* * * * *